US00RE46263E

(19) United States
(12) Reissued Patent
Cazzaniga et al.

(10) Patent Number: US RE46,263 E
(45) Date of Reissued Patent: Jan. 3, 2017

(54) CHARGE PUMP SYSTEM THAT DYNAMICALLY SELECTS NUMBER OF ACTIVE STAGES

(71) Applicant: SanDisk 3D LLC, Milpitas, CA (US)

(72) Inventors: Marco Cazzaniga, Palo Alto, CA (US); Tz-Yi Liu, Palo Alto, CA (US)

(73) Assignee: SanDisk Technologies LLC, Plano, TX (US)

(21) Appl. No.: 14/291,481

(22) Filed: May 30, 2014

Related U.S. Patent Documents

Reissue of:
(64) Patent No.: 8,339,185
Issued: Dec. 25, 2012
Appl. No.: 12/973,493
Filed: Dec. 20, 2010

(51) Int. Cl.
*G05F 1/46* (2006.01)
*H02M 3/18* (2006.01)

(52) U.S. Cl.
CPC . *G05F 1/46* (2013.01); *H02M 3/18* (2013.01)

(58) Field of Classification Search
CPC ..... G06F 1/46; H02M 3/18; H02M 3/073; H02M 3/07; G11C 5/145; G11C 29/021
USPC . 327/536; 307/110; 363/59, 60; 365/189.09, 365/226, 227
See application file for complete search history.

(56) References Cited

U.S. PATENT DOCUMENTS 3,697,860 A 10/1972 Baker
4,271,461 A 6/1981 Hoffmann et al.
4,511,811 A 4/1985 Gupta
4,583,157 A 4/1986 Kirsch et al.
4,621,315 A 11/1986 Vaughn et al.
4,636,748 A 1/1987 Latham, II
4,736,121 A 4/1988 Cini et al.
4,888,738 A 12/1989 Wong et al.
5,140,182 A 8/1992 Ichimura
5,168,174 A 12/1992 Naso et al.
5,175,706 A 12/1992 Edme
(Continued)

FOREIGN PATENT DOCUMENTS

CN 101764518 A 6/2010
CN 101902059 12/2010
(Continued)

OTHER PUBLICATIONS

First Office Action issued for Chinese Patent Application No. 2011800614031 mailed on Feb. 3, 2015, 4 pages.
(Continued)

*Primary Examiner* — My-Trang Ton
(74) *Attorney, Agent, or Firm* — Davis Wright Tremaine LLP

(57) ABSTRACT

A multi-stage charge pump selects the number of active stages dynamically. In the exemplary embodiment, this is done by having a multi-stage master charge pump section in which the number of active stages is settable and a slave charge pump section that is of the same design as the master section. The master section is used to drive the external load, while the slave section drives an adjustable internal load. The adjustable internal load is set by control logic by comparing the operation of the two sections. The control logic then operates the slave section with a different number of active stages than the master stage in order to determine whether the master stage is using the optimal number of active stages. The control logic can then change the number of active stages accordingly.

34 Claims, 8 Drawing Sheets

(56) References Cited

U.S. PATENT DOCUMENTS 5,263,000 A 11/1993 Van Buskirk et al.
5,335,198 A 8/1994 Van Buskirk et al.
5,392,205 A 2/1995 Zavaleta
5,436,587 A 7/1995 Cernea
5,483,434 A 1/1996 Seesink
5,508,971 A 4/1996 Cernea et al.
5,521,547 A 5/1996 Tsukada
5,532,653 A 7/1996 Adkins
5,539,351 A 7/1996 Gilsdorf et al.
5,553,030 A 9/1996 Tedrow et al.
5,563,779 A 10/1996 Cave et al.
5,563,825 A 10/1996 Cernea et al.
5,568,424 A 10/1996 Cernea et al.
5,570,315 A 10/1996 Tanaka et al.
5,592,420 A 1/1997 Cernea et al.
5,596,532 A 1/1997 Cernea et al.
5,602,794 A 2/1997 Javanifard et al.
5,621,685 A 4/1997 Cernea et al.
5,625,544 A 4/1997 Kowshik et al.
5,644,534 A 7/1997 Soejima
5,693,570 A 12/1997 Cernea et al.
5,712,778 A 1/1998 Moon
5,732,039 A 3/1998 Javanifard et al.
5,734,286 A 3/1998 Takeyama et al.
5,767,735 A 6/1998 Javanifard et al.
5,781,473 A 7/1998 Javanifard et al.
5,801,987 A * 9/1998 Dinh ..... 365/185.18
5,812,017 A * 9/1998 Golla et al. ..... 327/536
5,818,766 A 10/1998 Song
5,828,596 A 10/1998 Takata et al.
5,903,495 A 5/1999 Takeuchi et al.
5,943,226 A 8/1999 Kim
5,945,870 A 8/1999 Chu et al.
5,969,565 A 10/1999 Naganawa
5,969,988 A 10/1999 Tanzawa et al.
5,973,546 A 10/1999 Le et al.
5,982,222 A 11/1999 Kyung
6,008,690 A 12/1999 Takeshima et al.
6,016,073 A 1/2000 Ghilardelli et al.
6,018,264 A 1/2000 Jin
6,023,187 A 2/2000 Camacho et al.
6,026,002 A 2/2000 Viehmann
6,046,935 A 4/2000 Takeuchi et al.
6,104,225 A 8/2000 Taguchi et al.
6,107,862 A 8/2000 Mukainakano et al.
6,134,145 A 10/2000 Wong
6,147,566 A 11/2000 Pizzuto et al.
6,151,229 A 11/2000 Taub et al.
6,154,088 A 11/2000 Chevallier et al.
6,157,242 A 12/2000 Fukui
6,188,590 B1 2/2001 Chang et al.
6,198,645 B1 3/2001 Kotowski et al.
6,208,198 B1 3/2001 Lee
6,249,445 B1 6/2001 Sugasawa
6,249,898 B1 6/2001 Koh et al.
6,275,096 B1 8/2001 Hsu et al.
6,278,294 B1 8/2001 Taniguchi
6,285,622 B1 9/2001 Haraguchi et al.
6,288,601 B1 9/2001 Tomishima
6,297,687 B1 * 10/2001 Sugimura ..... 327/536
6,307,425 B1 10/2001 Chevallier et al.
6,314,025 B1 11/2001 Wong
6,320,428 B1 11/2001 Atsumi et al.
6,320,796 B1 11/2001 Voo et al.
6,320,797 B1 11/2001 Liu
6,329,869 B1 12/2001 Matano
6,344,959 B1 2/2002 Milazzo
6,344,984 B1 2/2002 Miyazaki
6,356,062 B1 3/2002 Elmhurst et al.
6,359,798 B1 3/2002 Han et al.
6,369,642 B1 4/2002 Zeng
6,370,075 B1 4/2002 Haeberli et al.
6,385,107 B1 5/2002 Bedaroda et al.
6,400,202 B1 6/2002 Fifield et al.
6,404,274 B1 6/2002 Hosono et al.
6,411,157 B1 6/2002 Hsu et al.
6,424,570 B1 7/2002 Le et al.
6,445,243 B2 9/2002 Myono
6,456,154 B2 9/2002 Sugimura
6,456,170 B1 9/2002 Segawa et al.
6,476,666 B1 11/2002 Palusa et al.
6,486,728 B2 11/2002 Kleveland
6,518,830 B2 2/2003 Gariboldi et al.
6,522,191 B1 2/2003 Cha et al.
6,525,614 B2 2/2003 Tanimoto
6,525,949 B1 2/2003 Johnson et al.
6,531,792 B2 3/2003 Oshio
6,538,930 B2 3/2003 Ishii et al.
6,545,529 B2 4/2003 Kim
6,556,465 B2 4/2003 Haeberli et al.
6,577,535 B2 6/2003 Pasternak
6,606,267 B2 8/2003 Wong
6,661,682 B2 12/2003 Kim et al.
6,703,891 B2 3/2004 Tanaka
6,724,241 B1 4/2004 Bedarida et al.
6,734,718 B1 5/2004 Pan
6,737,907 B2 5/2004 Hsu et al.
6,760,262 B2 7/2004 Haeberli et al. ..... 365/189.09
6,762,640 B2 7/2004 Katsuhisa
6,781,440 B2 8/2004 Huang
6,798,274 B2 9/2004 Tanimoto
6,819,162 B2 11/2004 Pelliconi
6,834,001 B2 12/2004 Myono
6,859,091 B1 2/2005 Nicholson et al.
6,878,981 B2 4/2005 Eshel
6,891,764 B2 5/2005 Li
6,894,554 B2 5/2005 Ito
6,922,096 B2 7/2005 Cernea
6,927,441 B2 * 8/2005 Pappalardo et al. ..... 257/299
6,933,768 B2 8/2005 Hausmann
6,944,058 B2 9/2005 Wong
6,954,386 B2 10/2005 Narui et al.
6,975,135 B1 12/2005 Bui
6,985,397 B2 1/2006 Tokui et al.
6,990,031 B2 1/2006 Hashimoto et al.
6,995,603 B2 2/2006 Chen et al.
7,002,381 B1 2/2006 Chung
7,023,260 B2 4/2006 Thorp et al.
7,030,683 B2 4/2006 Pan et al.
7,092,263 B2 8/2006 Chang
7,113,023 B2 9/2006 Cernea
7,116,154 B2 10/2006 Guo
7,116,155 B2 10/2006 Pan
7,120,051 B2 10/2006 Gorobets et al.
7,123,078 B2 10/2006 Seo
7,129,759 B2 10/2006 Fukami
7,135,910 B2 11/2006 Cernea
7,135,911 B2 11/2006 Imamiya
7,180,794 B2 2/2007 Matsue
7,205,682 B2 4/2007 Kuramori
7,208,996 B2 4/2007 Suzuki et al.
7,215,179 B2 5/2007 Yamazoe et al.
7,224,591 B2 5/2007 Kaishita et al.
7,227,780 B2 6/2007 Komori et al.
7,239,192 B2 7/2007 Tailliet
7,253,675 B2 8/2007 Aksin et al.
7,253,676 B2 8/2007 Fukuda et al.
7,259,612 B2 8/2007 Saether
7,276,960 B2 10/2007 Peschke
7,279,957 B2 10/2007 Yen
7,345,928 B2 3/2008 Li
7,348,829 B2 3/2008 Choy et al.
7,368,979 B2 5/2008 Govindu et al.
7,397,677 B1 7/2008 Collins et al.
7,436,241 B2 10/2008 Chen et al.
7,466,188 B2 12/2008 Fifield
7,468,628 B2 12/2008 Im et al.
7,495,500 B2 2/2009 Al-Shamma et al.
7,545,684 B2 6/2009 Nakagawa et al.
7,554,311 B2 6/2009 Pan
7,579,902 B2 8/2009 Frulio et al.
7,579,903 B2 8/2009 Oku
7,602,233 B2 10/2009 Pietri et al.
7,667,529 B2 2/2010 Consuelo et al.

(56) References Cited

U.S. PATENT DOCUMENTS

| | | | | |
|---|---|---|---|---|
| 7,671,572 | B2 | 3/2010 | Chung | |
| 7,696,812 | B2 | 4/2010 | Al-Shamma et al. | |
| 7,772,914 | B2 | 8/2010 | Jung | |
| 7,795,952 | B2 | 9/2010 | Lui et al. | |
| 7,830,203 | B2 | 11/2010 | Chang et al. | |
| 7,928,796 | B2 | 4/2011 | Namekawa | |
| 7,944,277 | B1 | 5/2011 | Sinitsky et al. | |
| 7,956,673 | B2 * | 6/2011 | Pan | 327/530 |
| 7,956,675 | B2 | 6/2011 | Saitoh et al. | |
| 7,969,235 | B2 | 6/2011 | Pan | |
| 7,973,592 | B2 | 7/2011 | Pan | |
| 8,040,174 | B2 | 10/2011 | Likhterov | |
| 8,093,953 | B2 | 1/2012 | Pierdomenico et al. | |
| 8,159,091 | B2 | 4/2012 | Yeates | |
| 8,193,853 | B2 | 6/2012 | Hsieh et al. | |
| 8,242,834 | B2 | 8/2012 | Chuang et al. | |
| 8,339,183 | B2 | 12/2012 | Htoo et al. | |
| 8,395,440 | B2 | 3/2013 | Sandhu et al. | |
| 8,604,868 | B2 | 12/2013 | Ucciardello et al. | |
| 8,643,358 | B2 | 2/2014 | Yoon | |
| 2002/0008566 | A1 | 1/2002 | Taito | |
| 2002/0014908 | A1 | 2/2002 | Lauterbach | |
| 2002/0075063 | A1 | 6/2002 | Hwang | |
| 2002/0075706 | A1 | 6/2002 | Foss et al. | |
| 2002/0101744 | A1 | 8/2002 | DeMone | |
| 2002/0130701 | A1 | 9/2002 | Kleveland | |
| 2002/0130704 | A1 | 9/2002 | Myono et al. | |
| 2002/0140463 | A1 | 10/2002 | Cheung | |
| 2002/0163376 | A1 | 11/2002 | Pappalardo et al. | |
| 2003/0128560 | A1 | 7/2003 | Saiki et al. | |
| 2003/0214346 | A1 | 11/2003 | Pelliconi | |
| 2004/0046603 | A1 | 3/2004 | Bedarida | |
| 2005/0024125 | A1 | 2/2005 | McNitt et al. | |
| 2005/0030088 | A1 | 2/2005 | Cernea | |
| 2005/0093614 | A1 | 5/2005 | Lee | |
| 2005/0195017 | A1 | 9/2005 | Chen et al. | |
| 2005/0237103 | A1 | 10/2005 | Cernea | |
| 2005/0248386 | A1 | 11/2005 | Pan et al. | |
| 2006/0098505 | A1 | 5/2006 | Cho et al. | |
| 2006/0114053 | A1 | 6/2006 | Sohara et al. | |
| 2006/0119393 | A1 | 6/2006 | Hua et al. | |
| 2006/0244518 | A1 | 11/2006 | Byeon et al. | |
| 2006/0250177 | A1 * | 11/2006 | Thorp et al. | 327/536 |
| 2007/0001745 | A1 | 1/2007 | Yen | |
| 2007/0053216 | A1 | 3/2007 | Alenin | |
| 2007/0069805 | A1 | 3/2007 | Choi et al. | |
| 2007/0126494 | A1 | 6/2007 | Pan | |
| 2007/0139099 | A1 | 6/2007 | Pan | |
| 2007/0139100 | A1 | 6/2007 | Pan | |
| 2007/0152738 | A1 | 7/2007 | Stopel et al. | |
| 2007/0210853 | A1 | 9/2007 | Maejima | |
| 2007/0211502 | A1 * | 9/2007 | Komiya | 363/59 |
| 2007/0222498 | A1 | 9/2007 | Choy et al. | |
| 2007/0229149 | A1 | 10/2007 | Pan et al. | |
| 2008/0012627 | A1 | 1/2008 | Kato | |
| 2008/0024096 | A1 | 1/2008 | Pan | |
| 2008/0024198 | A1 | 1/2008 | Bitonti et al. | |
| 2008/0042731 | A1 | 2/2008 | Daga et al. | |
| 2008/0068067 | A1 | 3/2008 | Govindu et al. | |
| 2008/0111604 | A1 | 5/2008 | Boerstler et al. | |
| 2008/0116963 | A1 | 5/2008 | Jung | |
| 2008/0136500 | A1 | 6/2008 | Frulio et al. | |
| 2008/0157731 | A1 | 7/2008 | Pan | |
| 2008/0157852 | A1 | 7/2008 | Pan | |
| 2008/0157859 | A1 | 7/2008 | Pan | |
| 2008/0218134 | A1 | 9/2008 | Kawakami et al. | |
| 2008/0239802 | A1 | 10/2008 | Thorpe et al. | |
| 2008/0239856 | A1 | 10/2008 | Thorpe et al. | |
| 2008/0278222 | A1 | 11/2008 | Conte et al. | |
| 2008/0307342 | A1 | 12/2008 | Furches et al. | |
| 2009/0033306 | A1 | 2/2009 | Tanzawa | |
| 2009/0051413 | A1 | 2/2009 | Chu et al. | |
| 2009/0058506 | A1 | 3/2009 | Nandi et al. | |
| 2009/0058507 | A1 | 3/2009 | Nandi et al. | |
| 2009/0063918 | A1 | 3/2009 | Chen et al. | |
| 2009/0091366 | A1 | 4/2009 | Baek et al. | |
| 2009/0121780 | A1 | 5/2009 | Chen et al. | |
| 2009/0121782 | A1 | 5/2009 | Oyama et al. | |
| 2009/0153230 | A1 | 6/2009 | Pan et al. | |
| 2009/0153231 | A1 | 6/2009 | Pan et al. | |
| 2009/0153232 | A1 | 6/2009 | Fort et al. | |
| 2009/0167418 | A1 | 7/2009 | Raghavan | |
| 2009/0174441 | A1 | 7/2009 | Gebara | |
| 2009/0184697 | A1 | 7/2009 | Park | |
| 2009/0296488 | A1 | 12/2009 | Nguyen et al. | |
| 2009/0315598 | A1 | 12/2009 | Namekawa | |
| 2009/0315616 | A1 | 12/2009 | Nguyen et al. | |
| 2009/0322413 | A1 | 12/2009 | Huynh et al. | |
| 2010/0019832 | A1 | 1/2010 | Pan | |
| 2010/0033232 | A1 | 2/2010 | Pan | |
| 2010/0074034 | A1 | 3/2010 | Cazzaniga | |
| 2010/0085794 | A1 | 4/2010 | Chen et al. | |
| 2010/0118625 | A1 | 5/2010 | Matano | |
| 2010/0127761 | A1 | 5/2010 | Matano | |
| 2010/0244935 | A1 | 9/2010 | Kim et al. | |
| 2010/0283549 | A1 | 11/2010 | Wang | |
| 2010/0302877 | A1 | 12/2010 | Bang | |
| 2011/0026329 | A1 | 2/2011 | Wada | |
| 2011/0133820 | A1 | 6/2011 | Pan | |
| 2011/0133821 | A1 | 6/2011 | Honda | |
| 2011/0148509 | A1 | 6/2011 | Pan | |
| 2011/0156803 | A1 | 6/2011 | Yap et al. | |
| 2011/0176370 | A1 | 7/2011 | Izumi et al. | |
| 2011/0254615 | A1 | 10/2011 | Raghunathan et al. | |
| 2012/0230071 | A1 | 9/2012 | Kaneda | |
| 2012/0274394 | A1 | 11/2012 | Chan | |
| 2013/0162229 | A1 | 6/2013 | Chan | |
| 2013/0181521 | A1 | 7/2013 | Khlat | |
| 2014/0085985 | A1 | 3/2014 | Pan et al. | |
| 2014/0375293 | A1 | 12/2014 | Pan et al. | |

FOREIGN PATENT DOCUMENTS

| | | | |
|---|---|---|---|
| DE | 10 2007 026290 | | 7/2008 |
| EP | 0 382 929 | A | 8/1990 |
| EP | 0 780 515 | A | 6/1997 |
| JP | 2007-020268 | A | 1/2007 |
| WO | 01/06336 | A1 | 1/2001 |
| WO | WO 2006/132757 | | 12/2006 |

OTHER PUBLICATIONS

Notification of Transmittal of the Int'l Searching Search Report and The Written Opinion of the International Searching Authority, or the Declaration for Int'l Appl. No. PCT/US2011/062662 dated Aug. 6, 2012, 11 pages.

First Office Action issued by the Chinese State Intellectual Property Office in Chinese Patent Application No. 2011800614031, mailed on Sep. 24, 2015, 2 page translation.

Third Office Action issued Mar. 15, 2016 in Chinese Patent Application No. 201180061403.1, filed Nov. 30, 2011. 3 pages.

Notice of Allowance in U.S. Appl. No. 13/926,442, mailed May 13, 2015, 9 pages.

Notice of Allowance in U.S. Appl. No. 14/041,522, mailed May 19, 2015, 8 pages.

U.S. Appl. No. 12/973,641, filed Dec. 20, 2010, 26 pages.

U.S. Appl. No. 13/228,605, filed Sep. 9, 2011, 21 pages.

Feng Pan et al., "Charge Pump Circuit Design", McGraw-Hill, 2006, 26 pages.

Louie Pylarinos et al., "Charge Pumps: An Overview", Department of Electrical and Computer Engineering University of Toronto, 7 pages.

Ang et al., "An On-Chip Voltage Regulator Using Switched Decoupling Capacitors," 2000 IEEE International Solid-State Circuits Conference, 2 pages.

U.S. Appl. No. 12/506,998 entitled "Charge Pump with Current Based Regulation" filed Jul. 21, 2009, 21 pages.

(56) References Cited

OTHER PUBLICATIONS

U.S. Appl. No. 12/634,385 entitled "Multi-Stage Charge Pump with Variable Number of Boosting Stages" filed Dec. 9, 2009, 33 pages.

* cited by examiner

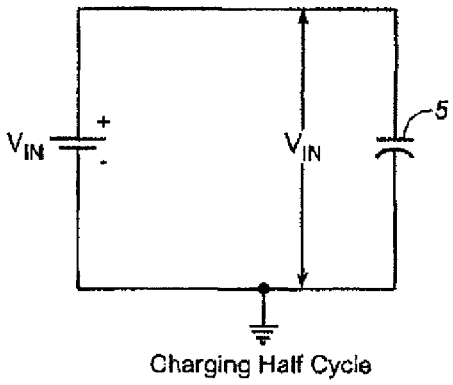
FIG. 1A
(PRIOR ART)
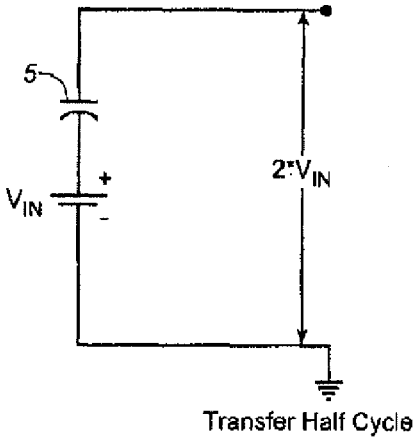
FIG. 1B
(PRIOR ART)
FIG. 2A
(PRIOR ART)
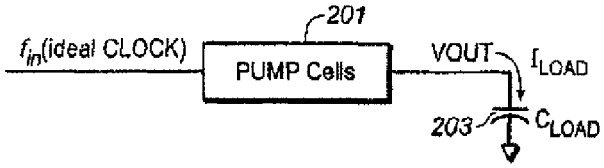
FIG. 2B
(PRIOR ART)
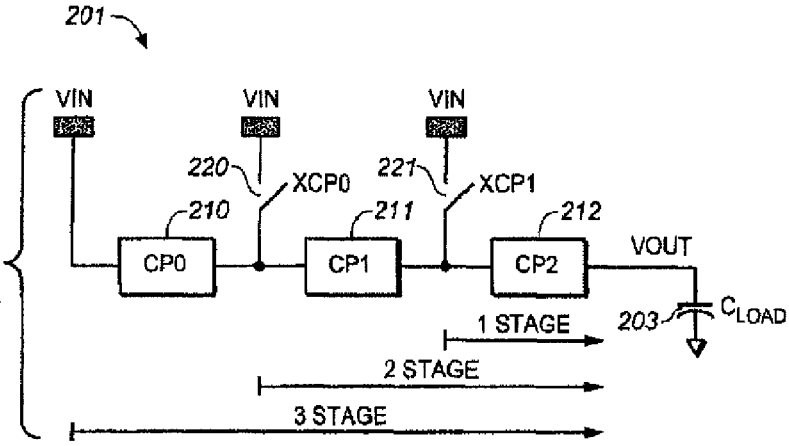

CHARGE PUMP SYSTEM THAT DYNAMICALLY SELECTS NUMBER OF ACTIVE STAGES

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

FIELD OF THE INVENTION

This invention pertains generally to the field of charge pumps and more particularly to multi-stage charge pumps where the number of active stages is variable.

BACKGROUND

Charge pumps use a switching process to provide a DC output voltage larger or lower than its DC input voltage. In general, a charge pump will have a capacitor coupled to switches between an input and an output. During one clock half cycle, the charging half cycle, the capacitor couples in parallel to the input so as to charge up to the input voltage. During a second clock cycle, the transfer half cycle, the charged capacitor couples in series with the input voltage so as to provide an output voltage twice the level of the input voltage. This process is illustrated in FIGS. 1a and 1b. In FIG. 1a, the capacitor 5 is arranged in parallel with the input voltage $V_{IN}$ to illustrate the charging half cycle. In FIG. 1b, the charged capacitor 5 is arranged in series with the input voltage to illustrate the transfer half cycle. As seen in FIG. 1b, the positive terminal of the charged capacitor 5 will thus be $2V_{IN}$ with respect to ground. By using several such stages, higher levels can be achieved.

Charge pumps are used in many contexts. For example, they are used as peripheral circuits on flash and other non-volatile memories to generate many of the needed operating voltages, such as programming or erase voltages, from a lower power supply voltage. A number of charge pump designs, such as conventional Dickson-type pumps, are know in the art. But given the common reliance upon charge pumps, there is an on going need for improvements in pump design, particularly with respect to trying to reduce the amount of layout area and the efficiency of pumps.

SUMMARY OF THE INVENTION

According to a first set of aspects, a charge pump system includes a master charge pump section to provide an output voltage at an external output node. The master charge pump section includes first regulation circuitry and a first charge pump. The first regulation circuitry is connected to receive the output voltage and a reference voltage and supply an oscillator signal having a frequency determined from the output voltage and the reference voltage. The first charge pump is connected to receive the oscillator frequency of the first regulation circuitry and to generate the output voltage while operating according to the oscillator frequency of the first regulation circuitry. The first charge pump has a plurality of stages and the number of active stages is settable by a first control signal. The charge pump system also includes an internal load having an adjustable value. The system further includes a slave charge pump section connected to drive the internal load and that includes second regulation circuitry and a second charge pump. The second regulation circuitry is connected to receive the voltage driving the internal load and the reference voltage and to supply an oscillator signal having a frequency determined from the voltage driving the internal load and the reference voltage. The second charge pump is connected to receive the oscillator frequency of the second regulation circuitry and to generate the voltage driving the internal load while operating according to the oscillator frequency of the second regulation circuitry, wherein the second charge pump has the same number of stages as the first charge pump and the number of active stages is settable by a second control signal. Control logic on the charge pump system is connected to master charge pump section to receive the oscillator frequency of the first regulation circuitry and supply the first control signal, to the slave charge pump section to receive the oscillator frequency of the second regulation circuitry and supply the second control signal, and is also connected to the internal load to set its adjustable value. The control logic can set the value of the adjustable load based upon a comparison of the oscillator frequencies of the first and second regulation circuitry while the first and second charge pumps are operating with the same number of active stages, and can alter the number of active stages in the first charge pump based upon a comparison of the oscillator frequencies of the first and second regulation circuitry while the first and second charge pumps are operating with a different number of active stages.

According to another set of aspects, a method of operating a charge pump system to drive an external load. The method includes driving the external load using a master charge pump of a multi-stage, frequency regulated design. The number of stages active in the master charge pump is settable, and the master charge pump drives the load using a first number of active stages and a first regulated frequency. The method also includes driving an adjustable internal load using a slave charge pump of the same design as the master charge pump, where the slave charge pump is driving the adjustable load using the first number of active stages and a second regulated frequency. The system determines a level of the internal load based upon a comparison of the first and second regulated frequencies and drives the internal load set to the determined level using the slave charge pump with a second number of active stages, where the second number is different than the first number, and using a third regulated frequency. The system determines whether to change the number of active stages in the master charge pump based upon a comparison of the first and third regulated frequencies.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

The various aspects and features of the present invention may be better understood by examining the following figures, in which:

FIG. 1a is a simplified circuit diagram of the charging half cycle in a generic charge pump.

FIG. 1b is a simplified circuit diagram of the transfer half cycle in a generic charge pump.

FIG. 2a is a box diagram of an open-loop charge pump.

FIG. 2b illustrates an arrangement of cells or stages within a charge pump.

DETAILED DESCRIPTION

In order to maximize power efficiency for a generic regulated charge-pump across the full output voltage range and across power supply, temperature and process corner variations, the techniques presented in following present a multi-stage charge pump where the number of active stages is selected dynamically. In the exemplary embodiment, this is done by having a multi-stage master charge pump section in which the number of active stages is settable and a slave charge pump section that is of the same design as the master section. The master section is used drive the external load, while the slave section drives an adjustable internal load. The adjustable load is set by control logic by comparing the operation of the two sections. The control logic then operates the slave sections with a different number of active stages than the master stage in order to determine whether the master stage is using the optimal number of active stages. The control logic can then change the number of active stages accordingly.

Figure 2C:
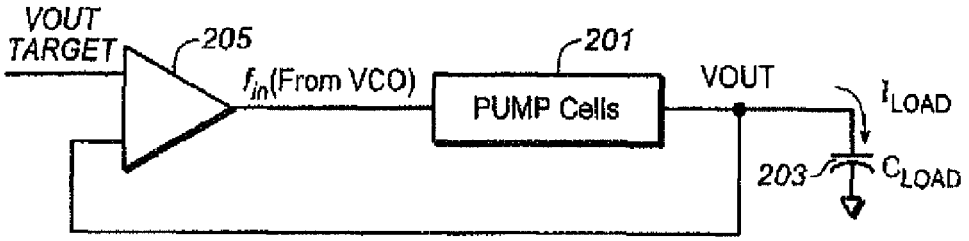
FIG. 2C (PRIOR ART)
FIG. 2c is a box diagram of a regulated charge pump.

Before discussing the exemplary embodiments, multi-stages charge pumps in general will be discussed some. A positive charge pump (CPP) 201, represented in FIG. 2a for an open-loop example, is a circuit that from an internal voltage VIN delivers an output voltage VOUT that is higher than VIN. (There are also negative charge pumps, and although the techniques of the exemplary embodiments can be extended to these, for purposes of this discussion only the positive case will be presented.) Very often VIN is equal to one of the power supplies voltages. The principle of operation of a charge pump is to alternatively charge some capacitors to VIN and then transfer such charge into a larger capacitor that is connected to the output node of the pump. The output capacitor, $C_{Load}$ 203, acts like a charge reservoir that can be eventually discharged by any currents from any devices connected to the pump's output node (IOUT). VOUT is determined by TOUT, $C_{Load}$ 203, the details of the internal stages and their capacitances, and the frequency $f_{in}$ at which the internal capacitors are driven. FIG. 2b is a block diagram of how the pump cells can be arranged in a variable stage pump. The three (in this example) stages CP0 210, CP1 211, CP2 212 are arranged in series to produce VOUT. When all three stages are active, VIN is fed into CP0 210 and progressively increased in each stage; when only two stages are used, switch XCP0 220 is closed, CP0 210 is not used, and CP1 211 starts with VIN rather than the output of CP0 210. Similarly, when only a single stage is used, XCP1 221 is closed so that CP2 212 starts with VIN instead of the output of CP1 211 and the first two stages are not actively pumping.

Figure 3:
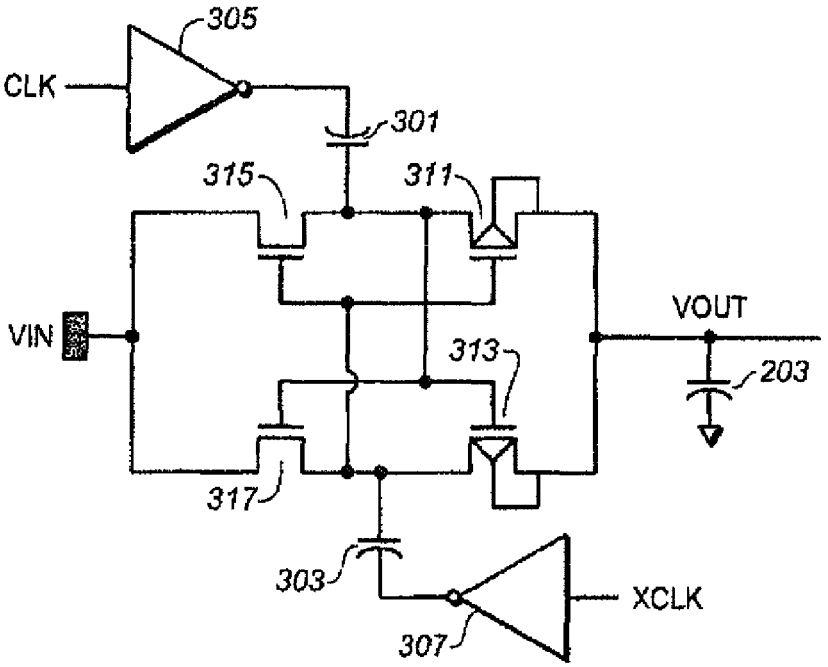
FIG. 3 (PRIOR ART)
FIG. 3 illustrates one example of a pump cell.

FIG. 3 shows one embodiment for a pump stage, such as CP2 212. This exemplary embodiment for a pump is of the voltage doubler variety and is discussed in more detail in U.S. Pat. No. 7,696,812. Briefly, the stage 212 is connected between an input voltage (here shown as VIN, but more generally, the output of the preceding stage) and its output node to supply the output level of the pump (as here) or the input to a subsequent stage. The stage has two legs, each with a capacitor (301, 303) having one plate connected to an internal intermediate node the other plate connected to receive one of a pair of non-overlapping clock signals (respectively CLK, XCLK) through an inverter (respectively 305, 307). The intermediate node of each leg is also cross-coupled to the control the gates of a pair of transistors on the other leg (NMOS 315, PMOS 311 on the upper leg as drawn, NMOS 317, PMOS 313 on the lower) that alternately connected the intermediate node to either the input node or to the output node. Ideally, the maximum VOUT achievable is two times VIN and if a higher output voltage is required, then multiple such stages have to be staggered one after the other. The unit circuit of the staggered design is then one of the cells.

If the desired VOUT is not equal to the actual VOUT (such as $2^N$*VIN, where N is the number of stages, for the pump design of FIG. 3), then an extra circuitry can be added that alters the period at which the charges stored into internal pump capacitors are transferred into $C_{Load}$ 203: This type of arrangement for a charge pump system is referred to as a regulated charge pump and is illustrated schematically in FIG. 2c. The pump output VOUT is again supplied to the load capacitor $C_{load}$ 203 and output node of the charge pump system, but is now also feed back to the regulation circuitry, here represented by a comparator 205. The output voltage VOUT is compared to the target value and the system's output adjusted accordingly, here by altering the frequency $f_{in}$ from a voltage controlled oscillator, to raise or lower VOUT.

For purposes of this exposition, when reference to a particular design is needed, the following discussion will use a 3-stage charge pump, where the individual stages are as shown in FIG. 3 and a frequency based regulation scheme is used. More generally, other arrangements for the number of stages, as long as there are two or more, and the pump stage and regulation arrangements can be used. For example, a variable number of voltage adder-type stages could be used. More information on charge pumps can be found, for example, in "Charge Pump Circuit Design" by Pan and Samaddar, McGraw-Hill, 2006, or "Charge Pumps: An Overview", Pylarinos and Rogers, Department of Electrical and Computer Engineering University of Toronto, available on the webpage "www.eecg.toronto.edu/~kphang/ece1371/chargepumps.pdf". Further information on various other charge pump aspects and designs can be found in U.S. Pat. Nos. 5,436,587; 6,370,075; 6,556,465; 6,760,262; 6,922,096; 7,030,683; 7,554,311; 7,368,979; 7,795,952; and 7,135,910; US Patent Publication numbers 2009-0153230-AI; 2009-0153232-A1; 2009-0315616-A1; 2009-0322413-A1; and 2009-0058506-A1; and application Ser. No. 11/295,906 filed on Dec. 6, 2005; Ser. No. 11/303,387 filed on Dec. 16, 2005; Ser. No. 11/845,939, filed Aug. 28, 2007; Ser. No.

12/135,948 filed Jun. 9, 2008; Ser. No. 12/506,998 filed on Jul, 21, 2009; and Ser. No. 12/570,646 filed on Sep. 30, 2009. Examples of a pump system with a variable number of branches can be found, for example, in U.S. Pat. No. 5,781,473 and with a variable number of stages can be found, for example, in U.S. Pat. Nos. 6,370,075 and 6,486,728 and in U.S. patent application Ser. No. 12/634,385 filed on Dec. 9, 2009.

Charge pumps find many applications in integrated circuit contexts where the system needs, in at least some phases of its operations, voltage values that extend beyond those available from the power supply. In particular, non-volatile memory devices often operate on fairly low supply voltage values, but require higher voltage levels for the writing and erasing of data. The techniques presented here can be advantageously used is such non-volatile memory devices, including the EEPROM based flash memory such as those described in U.S. Pat. Nos. 5,570,315, 5,903,495, 6,046,935 or the sort of "3D" structure presented in U.S. Pat. No. 7,696,812 and references found therein.

Figure 4A:
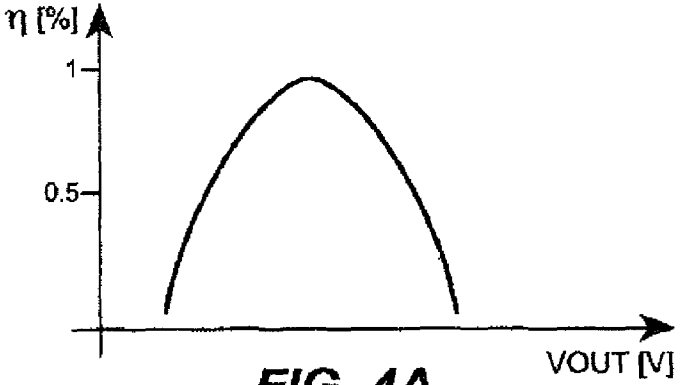
FIGS. 4a and 4b are plots for typical power efficiency vs. VOUT curves.
Figure 5A:
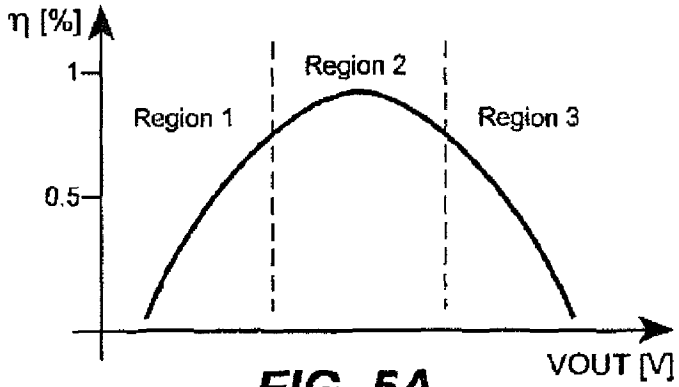
FIGS. 5a and 5b are respectively plots of power efficiency and frequency vs. VOUT for a charge pump.
Figure 5B:
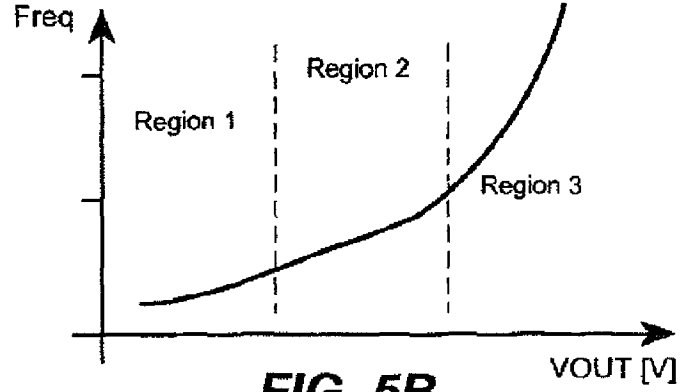

One commonly used figure of merit for a charge-pump circuit is the power efficiency ratio: $\eta$=(VOUT*IOUT)/(VIN*IIN), where VOUT=output voltage from the pump, IOUT=average current delivered by the pump to the load, IIN=average current delivered to the pump from VIN and VIN=lower reference voltage used to generate VOUT. The maximum value for $\eta$ is one, but this is never achieved with real circuits due to the non ideal properties of CMOS devices. Plotting the power efficiency versus output voltage for a wide voltage range, the output curve would typically be something like that shown in FIG. 4a, an upside down U shape. $\eta$ has only a limited range where reaches the highest value and then decreases fairly rapidly for both higher and lower output voltages. As shown in FIG. 5b, changing the number of active stages of the pump shifts the $\eta$ curve. From the same figure, it can be seen that for a specific output voltage there is only one configuration of number of stages that provides the highest efficiency.

In the prior art, the pump configuration is usually chosen based only on the required maximum VOUT voltage and usually does not take into consideration factors such variation in temperature, VIN and process variations that affect the systems output. With such an approach and for VOUT close to the values where two adjacent efficiency curves intersect, the variation of process or external variable could make the selected configuration to no longer be the optimum one in term of efficiency. In the techniques presented in the following, extra circuitry is added to the conventional charge pump that continuously monitors the efficiency of the pump and modifies its configuration in order to pick for each VOUT voltage the correct number of stages to achieve the maximum efficiency available by the topology of the charge-pump stage.

Figure 4B:
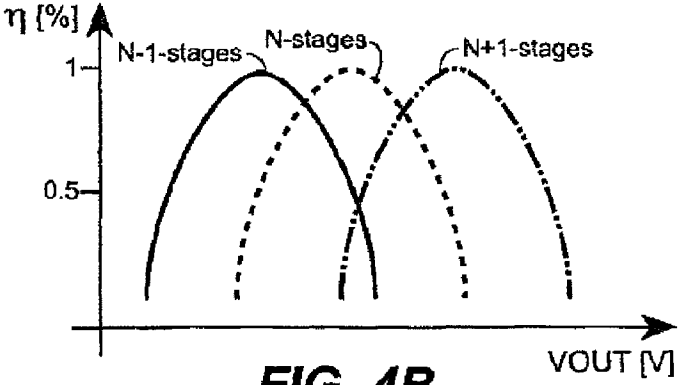

An underlying idea that the exemplary embodiments exploit is related to the efficiency plots of FIG. 4b. To help explain why $\eta$ versus output voltage has a reverse U type shape, it is useful to plot also the frequency of operation of the individual pumps, fclk, across the output voltage range. This is done in FIG. 5b. (FIG. 5a is similar to FIG. 4a, but split into 3 regions.) There are three regions of interest in the graphs: region 1, to the left of the peak, is where $\eta$ increases with VOUT; region 2 is where efficiency reaches the peak and then start to decrease; and region 3 where $\eta$ decreases rapidly. In the first region initially fclk is fairly constant while in the middle of region 1 starts to increase linearly. In this region the output voltage also increases fairly linearly. Entering region 2, VOUT and fclk both increase relatively linearly. After $\eta$ reaches the peak, any increase of VOUT has to be supported by a larger increase of fclk. Finally in region 3, VOUT saturates because it has reached the maximum output voltage obtainable by the pump stages while the frequency is still increasing exponentially. This can be explained with the help of FIG. 2c. In a frequency regulated charge pump, the frequency fclk is determined by a controller circuit that measures the difference between the target VOUT voltage and the real VOUT. As this error gets larger, the higher is the output voltage of the controller and, consequently, the higher the output clock frequency to the pump cells. In the linear region of the system, i.e. in Region 1 and middle of Region 2, increasing fclk correspondingly increases VOUT. In the rest of the regions, the system saturates and any increase in fclk has very little or no effect on VOUT. Consequently, in Region 3 the error increases, fclk is increased and requires more current from VIN, so that the efficiency will consequently decrease.

Figure 6A:
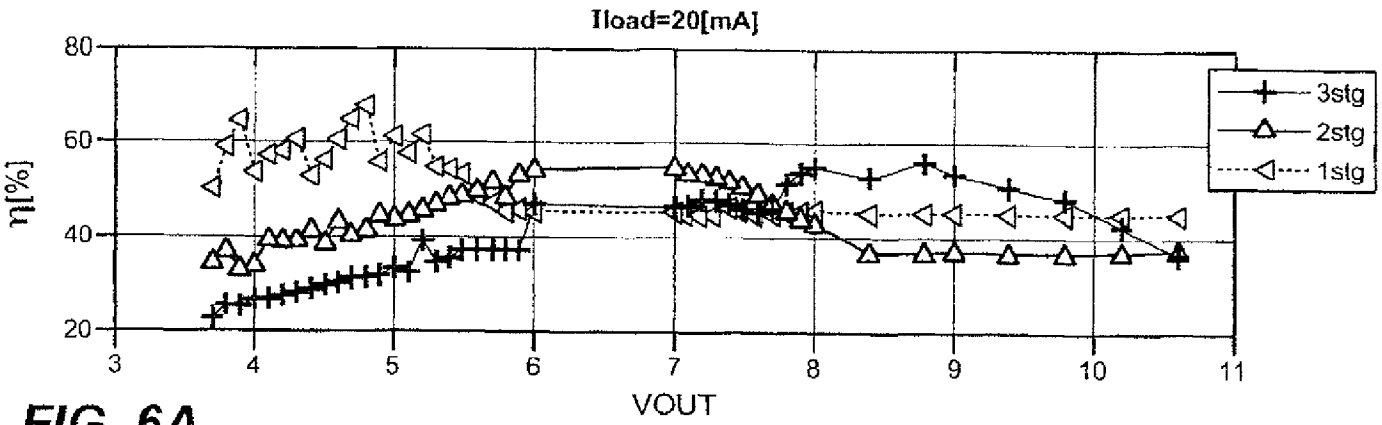
FIGS. 6a and 6b respectively illustrate efficiency and frequency vs. VOUT and number of enabled stages.
Figure 6B:
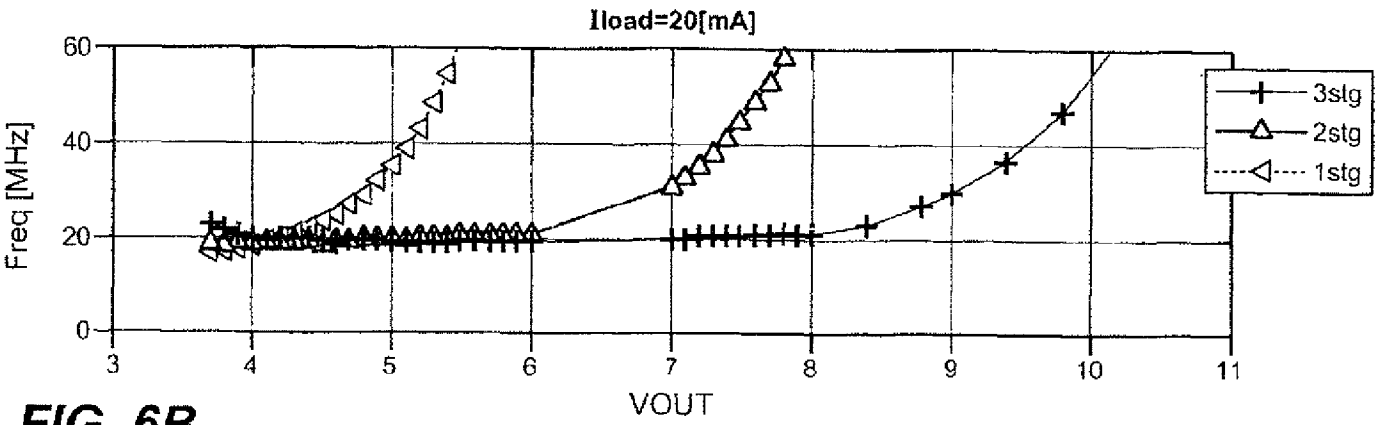

The frequency of operation is also affected by the number of stages being used in a charge pump. FIGS. 6a and 6b illustrate the situation for an actual charge pump having 1, 2 and 3 active stages and VOUT in the range of 3.5 to 9 Volts. The plot of FIG. 6a again shows three humps as in FIG. 4a, but for an actual pump. As shown in FIG. 6b, there is an initial flat phase, where the frequency is constant as it is at the lowest output the oscillator can deliver. The frequency the rises increasing rapidly as the pump reaches and exceeds its optimum efficiency for a give number of stages. In one principle aspect, the techniques presented here leverage this behavior that if the number of stages selected for the particular VOUT is too small then fclk will be much higher than the configuration with an extra stage enabled.

Figure 7:
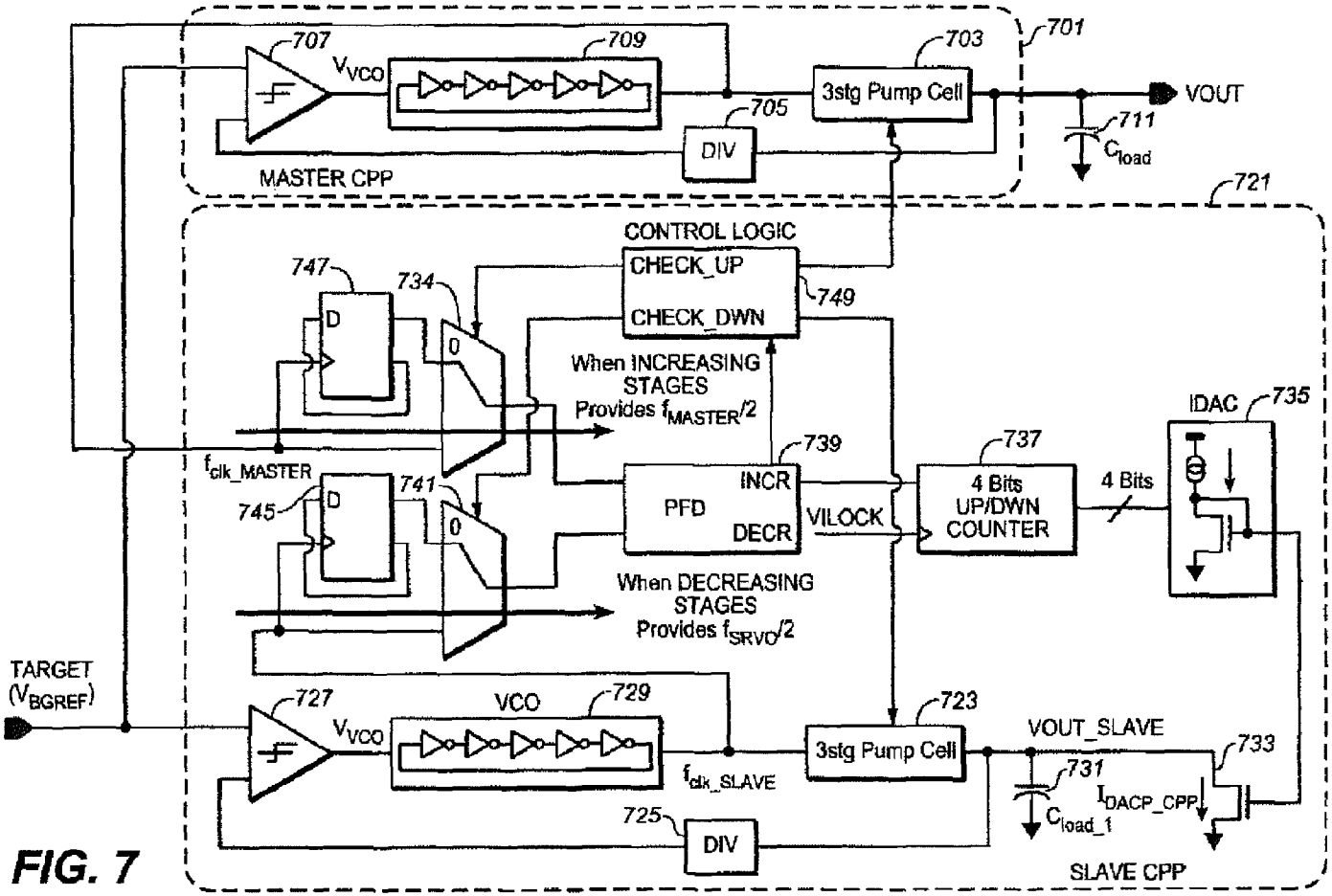
FIG. 7 is a circuit schematic of an exemplary embodiment of a charge pump system.

FIG. 7 is a circuit schematic of an exemplary embodiment of the charge-pump system. The output of the charge pump system is supplied by a master charge pump 701. This master charge pump can be of various designs, but in any case will be a multi-stage pump where the number of active stages is adjustable. In this example, the pump section itself is a 3 stage pump cell 703 that is connected directly to the output VOUT and delivers an output current IOUT, where there is again a load capacitor $C_{Load}$ 711 connected at the output node. For this discussion, the individual stages can be taken as shown in FIG. 3. The number of active stages in the pump 703 can be set by the control signal that is shown to come in at the bottom from the control logic 749 (discussed further below). The master pump section also includes regulation circuitry. The output voltage is fed back to the comparator 707, where it is compared to a reference voltage. The reference voltage can be supplied by a band gap or other accurate source, but as this reference value is typically quite a bit less than the desired VOUT value, which could, for example be a programming voltage in a non-volatile memory and have a value on the order of 20V. Consequently, to be able to compare these voltages, VOUT is typically ran through a voltage divider DIV 705. The output of comparator 707 is the voltage $V_{VCO}$ that is feed to the voltage controlled oscillator 709, which in turn generates the clock to drive the pump stages.

The lower portion of FIG. 7 is the slave charge pump section 721 that includes the actual slave charge pump itself as well as the various control circuitry used to determine the number of active stages. The slave charge pump proper includes the pump cells 723, where the number of active stages is again settable by the control logic 749, the voltage divider 725, the comparator 727, and voltage controller oscillator 729, with the node output (as VOUT_SLAVE) again connected to the load capacitor $C_{Load_1}$ 731. Although the slave pump need not be of the same design as the master section (for example, the pump stages themselves could be formed of small transistor, capacitors, or both, as they do not drive the actual load), the implementation is much more straightforward if they are of the same design with like sized elements. This requires that the same amount of circuit area be devoted to the slave section as to the master section, but in an actual application (such as in a non-volatile memory circuit) there may be many master pump section (hundreds in some cases) to supply sufficient current levels, while only a single slave section is needed, so that the actual increase in overhead circuitry is incremental fairly small.

The one replica charge pump can output the same VOUT as the main pump, but delivers a current IDAC_CPP which need only be a fraction of the master pump's IOUT. The load 733 for the charge pump is adjustable and is here taken as a transistor whose gate is controlled by IDAC 735, represented as a having a sort of current mirror arrange driven by the adjusted current. The other elements of the slave section 721 are used to set the value of the load 733 to mimic the actual load being driven by the master stage 701, vary the active number of stages in the slave pump cells 723 while driving this load, determine whether it is more efficient to drive the load with the varied number of stages, and, if so, alter the number of active stages in the master pump.

A phase-frequency detection (PFD) circuit 739 is connected to receive and compare the frequencies of the master section's oscillator 709 and the slave section's VCO 729. The PFD 739 can receive the value of each of these frequencies or a fraction of them. As discussed in the following, for determining the load value of 733, the frequencies are compared directly, while for determining the number of stages to use, fractional parts of the frequencies are compared. In the exemplary embodiment, both of the frequencies can be reduced by a factor of 2 by the latches 745 and 747, where the respective outputs are fed to the multiplexers 741 and 734. Whether the frequency or its reduced value is passed by the multiplexers is then determined by the control logic 749. The result of the comparison by PFD 739 into the control logic block 749. The control logic circuit 749 controls the timing and the number of enabled stages for both MASTER_CPP 701 and SLAVE_CPP 721. The detail of the control logic is also based on the number of stages active at the time.

In order to dynamically determine the number of enabled stages for MASTER_CPP 701, there are exemplary embodiment alternated two modes of operation of the SLAVE_CPP section 721. In the "locking mode" (ILOCK_PHASE), the slave pump 723 and the master pump 703 have the same number of active stages. By having the 4 (in this example) bit UP/DOWN counter 737 change the value of IDAC_CPP, the system varies the load to achieve the state where both charge pumps have the same output voltage and operate at the same frequency. The input VILOCK is used when the system is not trying to regulate the load to stop changing the count and freeze the IDAC value. (If design of the slave section differed from that of that of the master section, the equalization of loads would typically be more involved.) Once the loads of the two sections are the same, then in the testing phase the slave section can be used to determine whether the number of active stages is the number that should be used for the specific load.

In the testing mode the load is fixed to the value reached during the locking phase. The control logic circuit 749 then increases or decreases by one the number of active stages in 723. The frequencies are then compared again by PFD 739. If the number of stages of in the slave pump 723 is decreased, and the new frequency of the slave section is higher than that half the frequency of the master pump, then the control logic 749 decreases also the number of active stages in the master pump cells 703. This comparison is made by the control logic switching the multiplexer 734 to feed the output of 747 into PFD 739. To see whether more active stages would be better, the number of active stages in 723 is increased by one and the slave frequency ($f_{clk_SLAVE}$) is then compared with half the frequency of master value $f_{clk_MASTER}$. If $f_{clk_SLAVE}<0.5*f_{clk_MASTER}$, the control logic increments by one the number of active stages of the master charge-pump. The comparison based on half frequencies used in the example is somewhat empirical and based on the specifics of the particular pump's design, but for the voltage double structure of FIG. 3 that is used in the exemplary embodiment, the factor of 2 provides a good comparison ratio, as can be seen from the plots of FIGS. 6a and 6b. Also, the reduction in frequency by a half is readily implemented by the sort of arrangement shown in FIG. 7 using latches 745 and 747.

Figure 8:
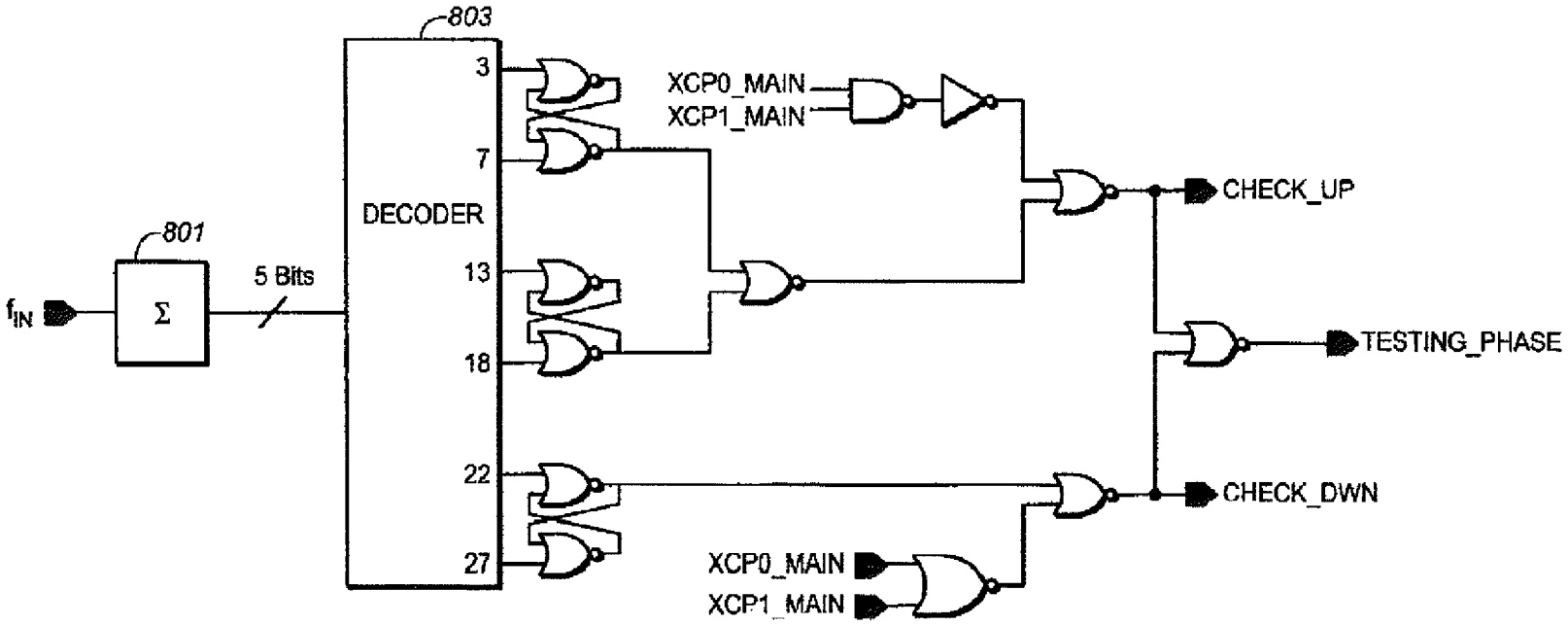
FIG. 8 is an example of the timing part of the control logic circuitry of FIG. 7.
Figure 9:
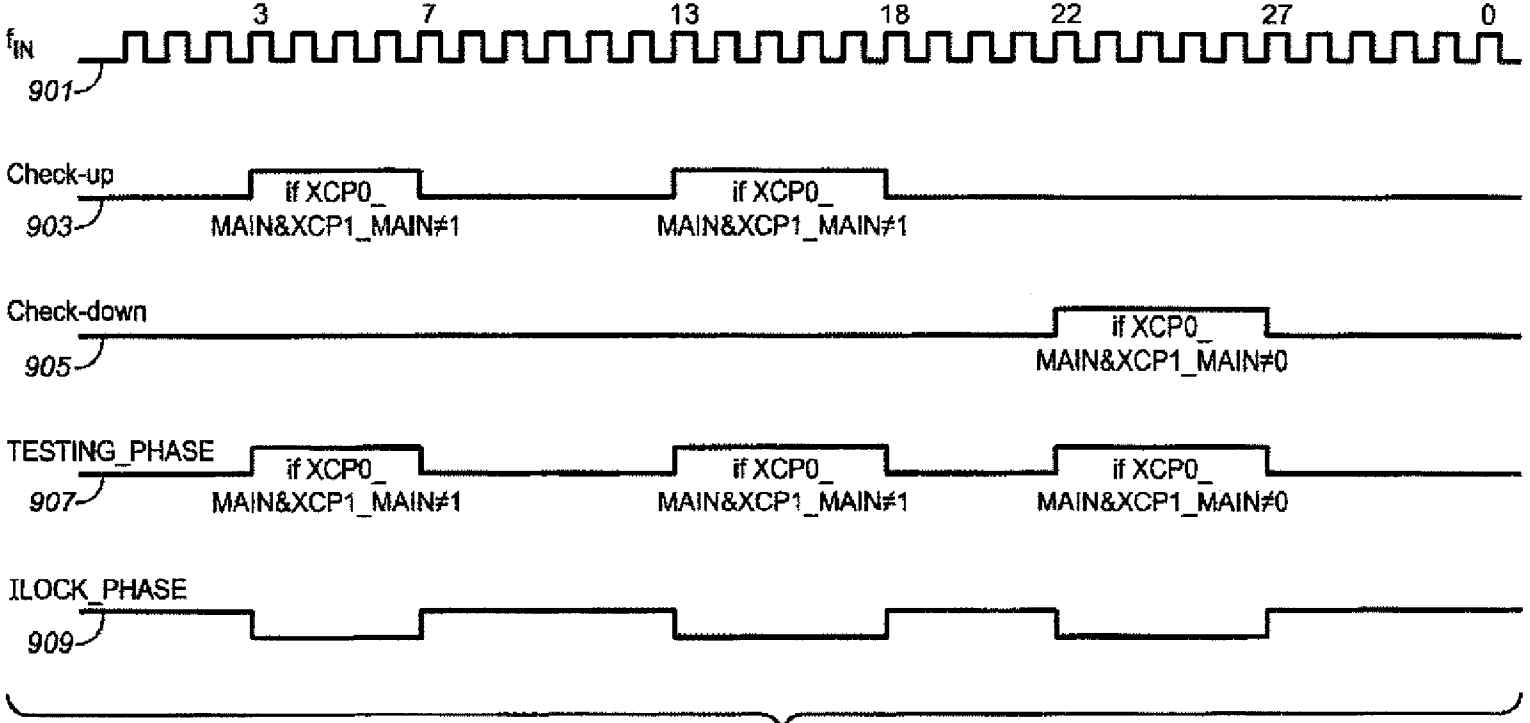
FIG. 9 is an exemplary timing diagram for the testing/locking modes of operation.

As the load on the master pump at VOUT can change, the load on the slave section needs be periodically adjusted to match and the number of active stages rechecked. The control logic circuit periodically alternates the two mode of operation as illustrated in the exemplary embodiment of FIG. 9, where some corresponding circuitry for control logic to use in determining these Testing/Locking modes of operation is shown in FIG. 8. The system clock $f_{IN}$ is shown in the top trace 901. The bottom line 909 is ILOCK_PHASE and is high when the load for the slave section is being set. The next trace up TESTING_PHASE 907 is the complement of this and is high when the load is set and the slave pump is operating with a different number of stages in the testing mode. This process repeating over 32 cycles with the transitions set to occur at the number of cycles noted in 901. 903 and 905 respectively indicate whether the test phase is using one more (Check_up high) or fewer (Check_down high) stages in the slave pump. Specifically, in this implementation the logic forces two consecutives Testing mode phases where we increment the SLAVE_CPP active stages and then we force a testing phase where we decrease the active stages of SLAVE_CPP. This is done as since in typical applications, it is more common when the output of the pump is called upon to increase rapidly. For example, in the case of a non-volatile memory, the pump may suddenly need to supply one of the quite high voltages used for erase or program operations. This sequence of events can be changed without affecting the overall principle of operation depending upon the pump's application.

FIG. 8 illustrates an example of some circuitry that the control logic can use to implement this timing. The system clock is fed into the summing circuit 801 and outputs a 5 bits value (corresponding to the cycle of 32 clocks in this example. The decoder 803 takes these 5 bits and, based on the numbers on its left side, asserts the various signals to the logic gates. The inputs XCP0_MAIN and XCP1_MAIN relate to the number of active stages in the master pump 703 and are shown in FIG. 2b. The outputs then determine which phase the system is in (Locking or Testing mode) and, if in texting phase, whether to check up or down.

Figure 10:
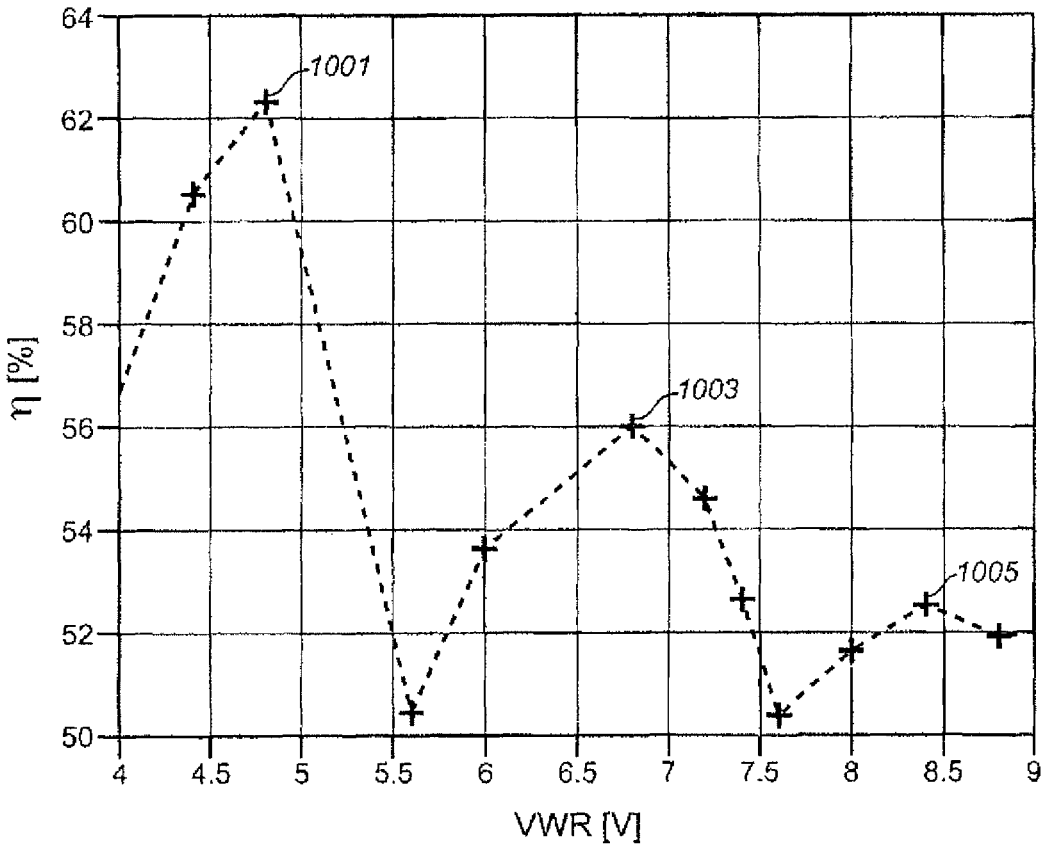
FIG. 10 is a power efficiency plot of the exemplary charge-pump system.

The result of the power efficiency for a pump system using this architecture is illustrate in FIG. 10, where it is shown that the algorithm can automatically switch between 1 (with peak 1001), 2 (with peak 1003) and 3 (with peak 1005) stages configurations. As shown, when the efficiency drops to near 50%, the system changes the number of active stages. Consequently, these techniques improve the efficiency of a charge-pumps that requires delivering an output voltage that ranges across a wide range and with a DC current load. This advantage is achieved by adding a circuit (the slave section 721) that has a very low DC current and can be implemented in standard CMOS logic with no requirement for high voltage type devices. The described arrangement can be used in parallel in a complementary manner with other pump system that optimize η by tweaking oscillator frequency or any improvements in the circuit used by the individual pump stage.

As noted above, the description above was based on a specific exemplary embodiment, but the techniques are more widely applicable to other multi-stage charge pump arrangement. The exemplary charge pump system of FIG. 7 used three stages, all of them taken to be of a particular voltage doubler design. More generally, the pump sections need only have two or more stages and other stage designs, including voltage adders or even a mixture of different types of stages. For different stage designs, some of the implementation detail will often need to be modified: for example, the decision on whether to increase or decrease the number of active stages may no longer depend on a relative factor of 2 for frequency comparisons for some or all of the stages since, if a voltage adder design is used, the relative frequency factor may changes depending on the active number of stages. The exemplary system also employs a frequency based regulation, but other regulation methods are known (see cited references above) and in these cases the appropriate regulation parameter would instead be compared during the testing mode. Also, the discussion above was for a positive charge pump system, but, with the appropriate changes the negative pump system can use the same sort of techniques for dynamically determining the number of active stages to use.

As discussed above, the arrangement of FIG. 7 requires the introduction the slave pump section and control circuitry, and the corresponding increase in required area. The area requirement can be reduced by sizing the slave section differently than the master section, but this complicates the comparison processes for the control circuitry and would likely require the system to go through a calibration process. In many typical charge pump applications, such as that described in U.S. Pat. No. 7,696,812 with respect to use in three dimensional memory array, to provide sufficient current a number of master pump sections (as many as several hundred in some cases) are used, all of which can have their active number of stages set by a single slave section; consequently, the additional incremental increase in circuitry to achieve this dynamic switching of the number of charge-pump stages is slight.

Although the invention has been described with reference to particular embodiments, the description is only an example of the invention's application and should not be taken as a limitation. Consequently, various adaptations and combinations of features of the embodiments disclosed are within the scope of the invention as encompassed by the following claims.

It is claimed:

1. A charge pump system comprising:

a master charge pump section to provide an output voltage at an external output node, including:

first regulation circuitry connected to receive the output voltage and a reference voltage and supply an oscillator signal having a frequency determined from the output voltage and the reference voltage; and a first charge pump connected to receive the oscillator frequency of the first regulation circuitry and to generate the output voltage while operating according to the oscillator frequency of the first regulation circuitry, wherein the first charge pump has a plurality of stages and the number of active stages is settable by a first control signal;

an internal load having an adjustable value;

a slave charge pump section connected to drive the internal load, including:

second regulation circuitry connected to receive a voltage driving the internal load and the reference voltage and supply another oscillator signal having a frequency determined from the voltage driving the internal load and the reference voltage; and a second charge pump connected to receive the other oscillator frequency of the second regulation circuitry and to generate the voltage driving the internal load while operating according to the oscillator frequency of the second regulation circuitry, wherein the second charge pump has the same number of stages as the first charge pump and the number of active stages is settable by a second control signal; and control logic connected to the master charge pump section to receive the oscillator frequency of the first regulation circuitry and supply the first control signal, connected to the slave charge pump section to receive the other oscillator frequency of the second regulation circuitry and supply the second control signal, and connected to the internal load to set the adjustable value thereof, wherein the control logic can set the adjustable value of the internal load based upon a comparison of the oscillator frequencies of the first and second regulation circuitries while the first and second charge pumps are operating with the same number of active stages, and can alter the number of active stages in the first charge pump based upon a comparison of the oscillator frequencies of the first and second regulation circuitries while the first and second charge pumps are operating with a different number of active stages.

2. The charge pump system of claim 1, wherein the first and second regulation circuitries each include:

a comparator having a first input connected to receive the reference voltage and a second input connected, for the first regulation circuitry, to receive a voltage derived from the output voltage and, for the second regulation circuitry, a voltage derived from the voltage driving the internal load, and an oscillator controlled by the output of the comparator to provide the oscillator frequency.

3. The charge pump system of claim 1, wherein the internal load includes a transistor connected between the output of the second charge pump and ground and having a gate voltage controlled by the control logic.

4. The charge pump system of claim 1, where the first and second charge pumps each have N stages, where N is an integer greater than 1, and the number of active stages in the first and second charge pumps is settable from 1 to N by the first and second control signals, respectively.

5. The charge pump system of claim 1, wherein when connected to drive an external load with the output voltage, the control logic alternately performs determinations of whether to adjust the internal load and of whether to alter the number of active stages in the first charge pump.

6. The charge pump system of claim 5, wherein the determinations of whether to alter the number of active stages includes determinations both of whether to increase and of whether to decrease the number of active stages in the first charge pump.

7. The charge pump system of claim 6, wherein the determinations of whether to alter the number of active stages further includes a repeating sequence of two determinations of whether to increase the number of active stages in the first charge pump and one determination of whether to decrease the number of active stages in the first charge pump.

8. The charge pump system of claim 1, wherein the control logic includes a frequency comparator circuit connected, when setting the value of the internal load, to receive the frequencies of the first and second regulation circuitries, where the control logic increases the value of the internal load when the frequency of the first regulation circuitry is higher than the frequency of the second regulation circuitry and decreases the value of the internal load when the frequency of the first regulation circuitry is lower than the frequency of the second regulation circuitry.

9. The charge pump system of claim 1, wherein the control logic includes a frequency comparator circuit connected, when determining whether to increase the number active stages in the first charge pump, to receive the frequency of the second regulation circuitry and a predetermined fraction that is less than one of the frequency of the first regulation circuitry while operating the second charge pump with one more active stage than the first charge pump.

10. The charge pump system of claim 1, wherein the control logic includes a frequency comparator circuit connected, when determining whether to decrease the number active stages in the first charge pump, to receive the frequency of the first regulation circuitry and a predetermined fraction that is less than one of the frequency of the second regulation circuitry while operating the second charge pump with one fewer active stage than the first charge pump.

11. A method of operating a charge pump system to drive an external load, comprising:

driving the external load using a master charge pump of a multi-stage, frequency regulated design, wherein the number of stages active is settable, and the master charge pump is driving the external load using a first number of active stages and a first regulated frequency;

driving an adjustable internal load using a slave charge pump of the same design as the master charge pump, wherein the slave charge pump is driving the adjustable internal load using the first number of active stages and a second regulated frequency;

determining a level of, the adjustable internal load based upon a comparison of the first and second regulated frequencies;

driving the adjustable internal load set to the determined level using the slave charge pump with a second number of active stages, wherein the second number is different than the first number, and using a third regulated frequency; and determining whether to change the number of active stages in the master charge pump based upon a comparison of the first and third regulated frequencies.

12. The method of claim 11, wherein the second number of stages is one greater than the first number of stages.

13. The method of claim 12, wherein determining whether to change the number of active stages in the master charge pump includes:

determining whether the third regulated frequency is greater than a predetermined fraction of the first regulated frequency, the predetermined fraction being between one and zero;

in response to determining that the third regulated frequency is greater than the predetermined fraction of the first regulated frequency, continuing to operate the master charge pump with the first number of active stages; and in response to determining that the third regulated frequency is not greater than the predetermined fraction of the first regulated frequency, subsequently operating the master charge pump with the second number of active stages.

14. The method of claim 13, wherein the predetermined fraction is one half.

15. The method of claim 11, wherein the second number of stages is one less than the first number of stages.

16. The method of claim 15, wherein determining whether to change the number of active stages in the master charge pump includes:

determining whether the first regulated frequency is greater than a predetermined fraction of the third regulated frequency, the predetermined fraction being between one and zero;

in response to determining that the first regulated frequency is greater than the predetermined fraction of the third frequency, subsequently operating the master charge pump with the second number of active stages; and in response to determining that the first regulated frequency is not greater than the predetermined fraction of the third regulated frequency, continuing to operate the master charge pump with the first number of active stages.

17. The method of claim 16, wherein the predetermined fraction is one half.

18. The method of claim 11, wherein determining the level of the adjustable internal load includes:

setting a value of an internal resistance by adjusting the value of the adjustable internal load to bring the second regulated frequency nearer to the first regulated frequency.

19. The method of claim 11, further comprising:

in response to determining to change the number of active stages of the master charge pump, subsequently operating the master charge pump with the second number of active stages.

20. The method of claim 19, further comprising:

subsequently cyclically repeating the process of determining the level of the adjustable internal load, driving the adjustable internal load, determining whether to change the number of active stages in the master charge pump, and subsequently operating the master charge pump with the determined number of active stages.

21. The method of claim 20, wherein the cyclically repeated determining whether to change the number of active stages in the master charge pump includes determinations both of whether to increase and of whether to decrease the number of active stages in the master charge pump.

22. The method of claim 21, wherein the determinations of whether to alter the number of active stages of the master charge pump includes a repeating sequence of two determinations of whether to increase the number of active stages in the master charge pump and one determination of whether to decrease the number of active stages in the master charge pump.

*23. The charge pump system of claim 1, wherein the charge pump system is a peripheral circuit element on a non-volatile memory device.*

*24. The charge pump system of claim 23, wherein the memory device is an EEPROM based flash memory.*

*25. The charge pump system of claim 23, wherein the charge pump system is a peripheral circuit element on a monolithic three-dimensional (3D) semiconductor memory device.*

*26. The charge pump system of claim 25, wherein the semiconductor memory device further comprises a three-dimensional (3D) non-volatile memory that includes multiple memory cells arranged in multiple physical levels above a silicon substrate.*

*27. The charge pump system of claims 26, wherein the charge pump system is connectable to the three-dimensional (3D) non-volatile memory to supply a programming voltage level thereto from the external output node of the charge pump system.*

*28. The charge pump system of claims 26, wherein the charge pump system is connectable to the three-dimensional (3D) non-volatile memory to supply an erase voltage level thereto from the external output node of the charge pump system.*

*29. The method of claim 11, wherein the charge pump system is a peripheral circuit element on a non-volatile memory device to which the charge pump system is connectable to drive as the external load.*

*30. The method of claim 29, wherein the memory device is an EEPROM based flash memory.*

*31. The method of claim 29, wherein the charge pump system is a peripheral circuit element on a monolithic three-dimensional semiconductor memory device.*

*32. The method of claim 31, wherein the semiconductor memory device further comprises a three-dimensional (3D) non-volatile memory that includes multiple memory cells arranged in multiple physical levels above a silicon substrate.*

*33. The method of claim 32, wherein the charge pump system is connectable to the three-dimensional (3D) non-volatile memory to supply a programming voltage level thereto.*

*34. The method of claim 32, wherein the charge pump system is connectable to the three-dimensional (3D) non-volatile memory to supply an erase voltage level thereto.*

* * * * *